United States Patent [19]

Edwards et al.

[11] Patent Number: 4,717,894
[45] Date of Patent: Jan. 5, 1988

[54] CALIBRATION OF VECTOR MODULATORS USING A SCALAR DETECTOR

[75] Inventors: Allen P. Edwards, Palo Alto; David R. Gildea, Menlo Park; Chung Y. Lau, Foster City, all of Calif.

[73] Assignee: Hewlett-Packard Company, Palo Alto, Calif.

[21] Appl. No.: 922,383

[22] Filed: Oct. 23, 1986

[51] Int. Cl.⁴ .................. G01R 35/00; H03C 5/00
[52] U.S. Cl. ........................... 332/20; 332/17; 332/18; 455/67; 455/115
[58] Field of Search .............. 332/20, 39, 18, 37 R, 332/17; 455/63, 67, 115; 375/11, 15, 52, 57, 58

[56] References Cited

U.S. PATENT DOCUMENTS 4,540,958  9/1985  Neyens et al. .................. 332/22 X

*Primary Examiner*—Siegfried H. Grimm
*Attorney, Agent, or Firm*—James M. Williams

[57] ABSTRACT

Calibration of a vector modulator is done using a scalar detector to measure the amplitude of the RF output signal, phase shifters to adjust the relative phases of the I and Q components of the RF carrier, and variable attenuators in the I and Q modulation signal input lines to adjust the relative amplitude of the modulation signals. DC signal sources provide reference signals for the I and Q modulation inputs, carrier leak compensation signals, and calibration signals for balancing the amplitude of the I and Q modulation signals. An iterative four step calibration process is followed until no change in the results is observed. The quadrature phase error is minimized by adjusting the phase shifters. The carrier leakage is minimized by adjusting the carrier leak compensation sources to minimize RF output with the modulation inputs grounded. The amplitudes of the I and Q modulation signals are balanced by adjusting the attenuators until the output amplitudes are equal. Finally, the quadrature calibration signal sources are adjusted until the output amplitudes they produce are balanced.

3 Claims, 6 Drawing Figures

CALIBRATION OF VECTOR MODULATORS USING A SCALAR DETECTOR

BACKGROUND AND SUMMARY OF THE INVENTION

The invention relates to calibration of vector or quadrature (I/Q) modulators, in particular to calibration of a vector modulator using only one scalar detector.

A major trend in microwave communications is the switch to digital communication, using digital modulation techniques. These techniques require a new class of signal modulators which perform vector or quadrature modulation. A vector modulated signal is an amplitude and phase modulated signal that is modulated according to in-phase and quadrature phase components, which define a phase vector. In vector modulation, two modulation input signals independently modulate the in-phase (I) and quadrature (Q) components of the carrier. For proper operation, the I and Q channels of the modulator must be calibrated to be equal in gain, i.e., balanced, and precisely 90° apart, i.e., in quadrature.

One way to calibrate a vector modulator is with a network analyzer connected to the RF carrier input and to the RF modulated output. The network analyzer measures the amplitude and phase of the RF modulated output resulting from varying DC voltages applied to the I and Q modulation inputs. From these measurements, the gain and phase accuracy of the modulator can be determined, and calibrated. The drawback with this method is that it is an expensive and somewhat cumbersome solution, and therefore it does not lend itself to incorporation into a vector modulator for self calibration. It is also limited in accuracy for most network analyzers.

An object of the present invention is to provide apparatus and a method for calibrating a vector modulator that does not require a network analyzer, but instead uses a scalar RF detector. This improves the accuracy of the calibration measurement and makes the calibration system compact and inexpensive enough to be incorporated in the vector modulator for self calibration.

The present invention accomplishes this and other objectives with a system comprising a standard vector modulator circuit modified by adding phase shifters to adjust the relative phases of the I and Q components of the RF carrier. Variable attenuators are inserted in the I and Q modulation signal input lines to adjust the relative amplitude of the modulation signals.

Calibration measurements are made using a scalar detector to measure the amplitude of the RF output signal. Two DC signal sources provide reference signals for the I and Q modulation inputs. Two other DC signal sources provide carrier leak compensation signals. A final DC signal source 239 provides calibration signals for balancing the amplitude of the I and Q modulation signals.

An iterative four step calibration process is followed until no change in the results is observed. The quadrature phase error is minimized by adjusting the phase shifters. The carrier leakage is minimized by adjusting the carrier leak compensation sources to minimize RF output with the modulation inputs grounded. The amplitudes of the I and Q modulation signals are balanced by adjusting the attenuators until the output amplitudes are equal. Finally, the quadrature calibration signal sources are adjusted until the output amplitudes they produce are balanced. This series of adjustments is repeated until no further changes are observed.

BRIEF DESCRIPTION OF THE DRAWINGS

FIG. 3B illustrates the result when the I and Q channels are not exactly at quadrature. FIG. 3C illustrates the result when the I and Q channels are 90° out of phase, but they are not balanced.

DETAILED DESCRIPTION OF THE INVENTION

Figure 1:
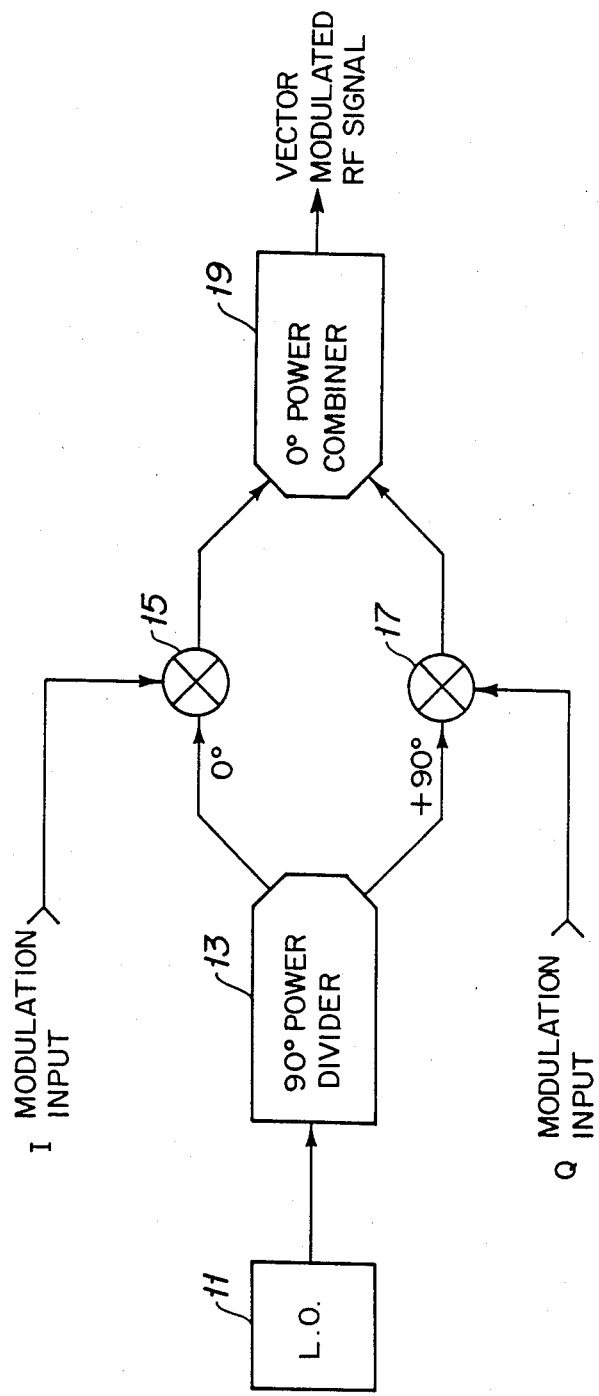
FIG. 1 shows a schematic block diagram of a vector modulator.

A vector modulator (also referred to as an I/Q modulator) applies two separate modulation signals to modulate the in-phase (I) and quadrature (Q) components of a carrier signal. FIG. 1 shows a schematic block diagram of a typical vector modulator. An RF carrier signal generated by local oscillator 11 is divided into I and Q components by a 90° power divider 13. The I component, with a phase defined as 0° is applied to the LO input of mixer 15. The I channel modulation signal is applied to another input of mixer 15 to produce a modulated I signal. The Q component, with a 90° phase difference from the I component, is applied to an input of mixer 17. The Q channel modulation signal is applied to another input of mixer 17 to produce a modulated Q signal. The modulated I and Q signals are combined by a 0° power combiner 19 to produce the vector modulated RF output signal.

The principal errors in the vector modulated signals produced by this modulator design can be attributed to carrier leakage, amplitude imbalance of the I and Q channels, and quadrature phase error.

Carrier leakage is the appearance of an output signal from the mixers even when the modulation inputs are grounded. This can be caused by a non-zero offset voltage in a mixer, capacitive or inductive coupling of the LO signal across the mixer, and impedance mismatches at the mixer ports. Amplitude imbalance is caused by the differences in conversion losses of the I and Q mixers. Phase quadrature errors are due to miscalibration (design tolerances) of the 90° power splitter and the 0° power combiner, and to differences in the electrical path length of the I and Q channels.

Figure 2:
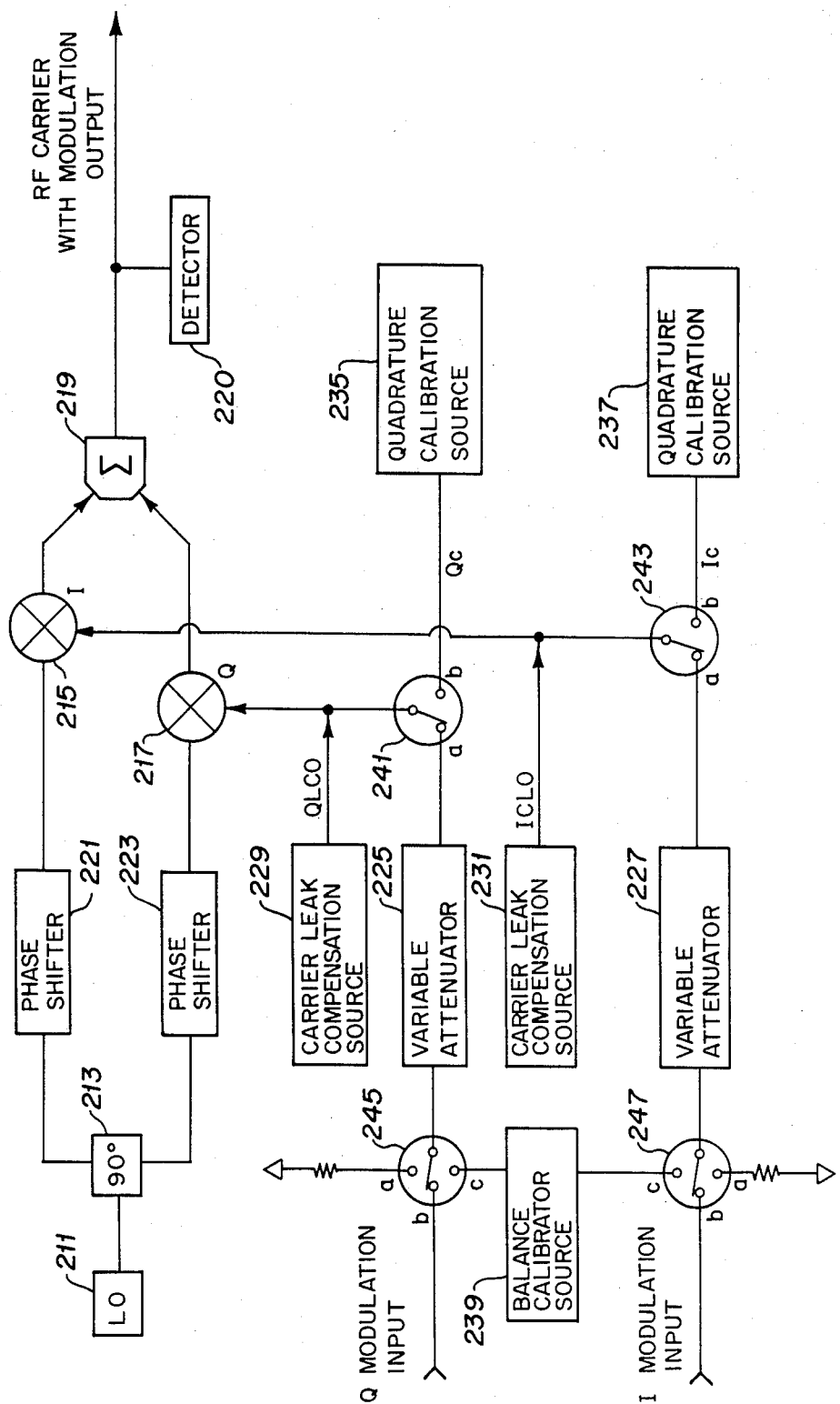
FIG. 2 shows a schematic block diagram of a vector modulator incorporating the calibration system of the invention.

In a vector modulator incorporating the present invention, shown schematically in FIG. 2, these three sources of error can be greatly reduced by a self-calibration procedure.

In FIG. 2, components functionally the same as the components in FIG. 1 bear the same reference numbers preceded by a 2. For instance, mixer 215 in FIG. 2 is functionally equivalent to mixer 15 in FIG. 1.

In FIG. 2, the basic vector modulation circuit is modified by adding phase shifters 221 and 223 between power splitter 213 and mixers 215 and 217 to adjust the relative phases of the I and Q components of the RF carrier. Variable attenuators 225 and 227 are inserted in the I and Q modulation signal input lines to adjust the relative amplitude of the modulation signals.

Calibration measurements are made using detector 220 to measure the amplitude of the RF output signal. DC signal sources 235 and 237 provide reference signals for the Q and I modulation inputs, when connected by switches 241 and 243 to mixers 217 and 215 in place of the I and Q modulation signals. DC signal sources 229 and 231 provide carrier leak compensation signals for the Q and I signal components, respectively. Signal source 239, which can be selectively connected to either the I or Q input lines by switches 245 and 247, provides calibration signals for balancing the I and Q amplitude.

Figure 3A:
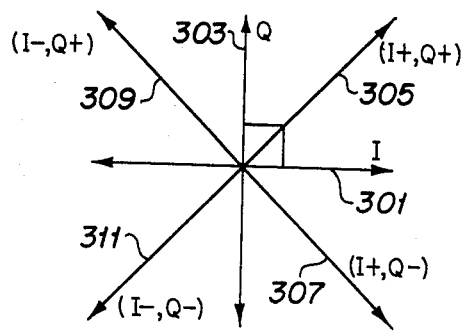
FIGS. 3A to 3C illustrate the theory of operation of vector modulators and the calibration technique of the invention. The proper operation of a vector modulator is shown in FIG. 3A.
Figure 3B:
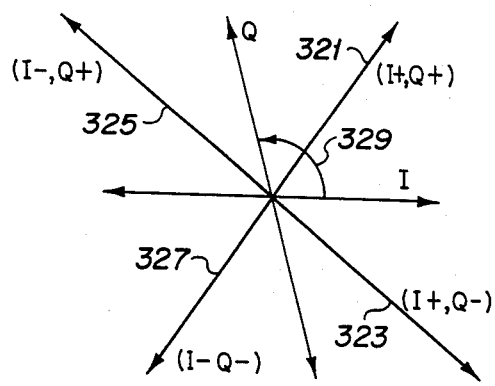
Figure 3C:
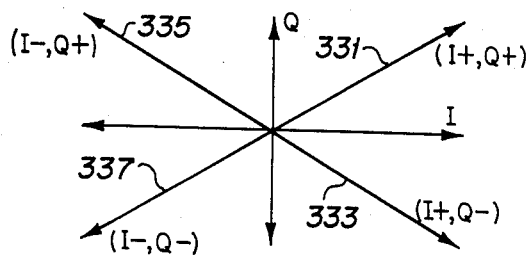

FIGS. 3A to 3C illustrate the theory of operation of vector modulators and the calibration technique of the invention. The diagrams of FIGS. 3A, and 3C are plots of signals in the vector domain, with the amplitude of a signal represented by distance from the origin and the relative phase of a signal represented by its angular displacement from an arbitrary reference signal. The phase of the I modulation signal is used as the reference phase in FIGS. 3A, 3B, and 3C. The frequency of the signal is not represented, but is implicitly assumed to be the same as the reference frequency, usually the carrier frequency. The proper operation of a vector modulator is shown in FIG. 3A. A DC voltage applied to the I modulation input results in the in-phase modulated signal (I) 301. The same voltage applied to the Q modulation input results in the quadrature modulated signal (Q) 303. If the vector modulator is perfectly calibrated, the in-phase modulation signal (I) 301 and the quadrature modulation signal (Q) 303 are exactly 90° out of phase and the amplitudes of the signals are equal. The combinations of the positive and negative polarity modulation vectors produce four different resultant vectors 305, 307, 309 and 311 which are also in quadrature and have equal amplitude.

If the I and Q modulated signals are balanced in amplitude, but they are not exactly 90° out of phase, there is some quadrature phase error, and a situation similar to the one shown in FIG. 3B results. In the example shown, the angle 329 between the I and Q modulated signals is greater than 90°. The resultant vectors are in quadrature, but they do not have equal amplitude. The (I+,Q+) vector 321 and (I−,Q−) vector 327 are smaller than the (I+,Q−) vector 323 and (I−,Q+) vector 325.

If the I and Q modulated signals are 90° out of phase, but they differ in amplitude, there is an amplitude imbalance error, and a situation similar to the one shown in FIG. 3C results. The resultant vectors have equal amplitude, but they are not in quadrature. The (I+,Q+) vector 331 is less than 90° from the (I+,Q−) vector 323.

Calibrating a vector modulator requires correcting both the phase and amplitude errors illustrated in FIGS. 3B and 3C, and minimizing the carrier leakage. Using the calibration method and apparatus of the invention, this can be done with a detector that measures only the amplitude of the resultant RF output signal, and is not itself calibrated.

In operation, an iterative process comprising four steps is followed until no change in the results is observed. Referring again to FIG. 2, the aggregate quadrature phase error of divider 213, mixers 215 and 217, and combiner 219 is minimized by adjusting phase shifters 221 and 223. The carrier leakage is minimized by adjusting signal sources 229 and 231 to minimize the RF output when the modulation inputs are grounded. The amplitudes of the Q and I modulation signals are balanced by adjusting attenuators 225 and 227 until the RF output amplitudes produced are equal. Finally, the quadrature calibration signals from DC signal sources 235 and 237 are adjusted until the RF output amplitudes they produce are balanced. This series of adjustments is repeated until no further changes are observed.

An important aspect of the calibration procedure is that the measurements involve either minimizing the RF output or equalizing the amplitudes of two measurements. Thus the RF detector does not have to be accurately calibrated.

To measure the quadrature phase error, switches 241 and 243 are switched to "b" to connect DC signal source 235 to the mixer 217 for the Q channel, and to connect DC signal source 237 to the mixer 215 for the I channel. Signal sources 235 and 237 provide DC reference signals with positive or negative values. Signal source 235 provides reference signals Qc+ and Qc− for the Q channel. Qc+ and Qc− have the same amplitude but opposite polarity. Signal source 237 provides reference signals Ic+ and Ic− for the I channel. Ic+ and Ic− have the same amplitude but opposite polarity. Detector 220 measures the amplitude of the RF output signal for the four combinations of reference signals (Ic+,Qc+), (Ic+,Qc−), (Ic−,Qc+) and (Ic−,Qc−). The phase shifters 221 and 223 are then adjusted so that the sum of the RF output amplitudes produced by the (Qc+,Ic+) and (Qc−,Ic−) combinations is equal to the sum of the RF output amplitudes produced by the (Qc+,Ic−) and (Qc−,Ic+) combinations. For example, if the sum of the RF output amplitudes produced by the (Qc+,Ic+) and (Qc−,Ic−) combinations is larger, the phase delay introduced by phase shifter 221 should be reduced (see FIG. 3B). A search procedure is followed to iteratively measure the four output signal amplitudes and adjust the phase shifters until a balanced condition is reached. When this operation is done, switches 241 and 243 are returned to "a".

The next step of the calibration procedure is to reduce the level of carrier leakage. To do this, switches 245 and 247 are switched to "a" to connect the modulation input lines to ground. With detector 220 measuring the amplitude of the RF output signal, DC signal source 229 which produces the carrier leak compensation signal QCLO is adjusted to minimize the amplitude of the RF output signal. This minimizes the Q component of the carrier leakage. Similarly, DC signal source 231 which produces the carrier leak compensation signal ICLO is adjusted to minimize the amplitude of the RF output signal. This minimizes the I component of the carrier leakage. After this step is done, switches 245 and 247 are switched to "b" to reconnect the modulation inputs to the input lines.

Figure 4:
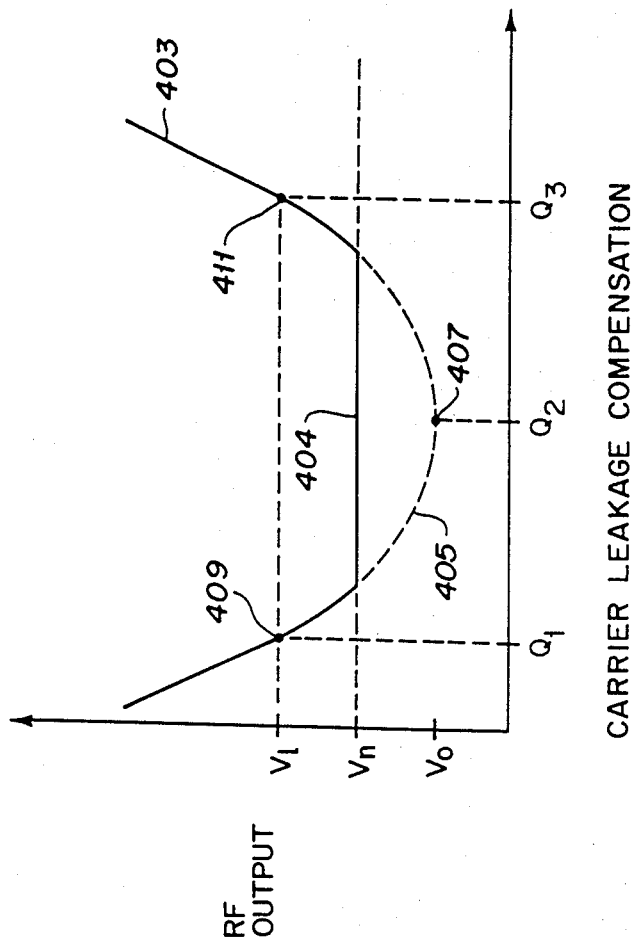
FIG. 4 is a graph showing the relationship between RF Output and Carrier Leakage Compensation.

The accuracy of the minimum point for the RF output signal is limited by the sensitivity of the detector. FIG. 4 illustrates the measurement of the RF output minimum point, showing the measured response curve 403 (solid line). Because the minimum signal level $V_O$ is below the background noise sensitivity limit $V_n$ of the detector, a portion 404 of the measured RF response curve appears to be flat for a range of QCLO AND ICLO values near the minimum. The true response curve 405 (dashed line) near the minimum point 407, cannot be directly measured. To locate a better approximation of the minimum point, an interpolation between two points above the sensitivity threshold is used, based on the assumption that the response curve is symmetrical near the minimum point. First, varying the level of the compensation signal, a point is selected below the minimum region 404, in a region of the curve 403 that has measurable slope, e.g., point 409. At point 409, the RF output is $V_l$ and the compensation signal level is $Q_1$. Then, a second point is located above the minimum, where the F output is also $V_l$, e.g., point 411, and the compensation signal level $Q_3$ is noted. The final compensation signal is then set midway between $Q_1$ and $Q_3$, at $Q_2$, to produce the minimum RF output, $V_O$, at point 407.

The next step is to balance the amplitude of the I and Q modulated signals, which is done by adjusting the attenuation of the I and Q modulation inputs. Switch 245 is switched to "c" to connect DC signal source 239 to the Q channel mixer 217, and switch 247 is switched to "a" to ground the input to I channel mixer 215. DC signal source 239 produces a reference signal and detector 220 measures the amplitude of the resulting RF output signal, the Q modulated signal. Then switch 245 is switched to "a" to ground the Q input and switch 247 is switched to "c" to connect the calibration signal from source 239 to the I input, and detector 220 makes a second amplitude measurement. The variable attenuator for the channel with the larger amplitude is adjusted to decrease the amplitude to that of the other channel, and the amplitude measurements are repeated until the measured amplitudes are equal. When this step is completed, switches 245 and 247 are returned to "b" to reconnect the modulation inputs.

Next, the amplitudes of the quadrature calibration signals from DC signal sources 235 and 237 are adjusted. Switch 241 is switched to "b", switch 243 is switched to "a", and switch 247 is switched to "a". Detector 220 measures the amplitude of the output signal with positive and negative polarities of the calibration signal. The calibration signal amplitudes for source 235 are adjusted until the output signal amplitudes are equal. Then switch 243 is switched to "b", switch 241 is switched to "a", and switch 245 is switched to "a". Again, detector 220 measures the amplitude of the output signal with positive and negative polarities of the calibration signal. The calibration signal amplitudes for source 237 are adjusted until the output signal amplitudes are equal to each other, and to those for source 235.

This four step procedure is repeated sequentially until no changes are observed: reducing the quadrature phase error, reducing the carrier leakage, balancing the amplitudes of the modulated signals, and balancing the quadrature calibration signals. Iteration is important because the errors are interdependent. In a well designed modulator, the errors are small and the calibration procedure converges quite rapidly, within 2 or 3 cycles.

It should be noted that the calibration could be carried out with only one phase shifter and one variable attenuator, rather than the two used in the preferred embodiment. Also the RF output signal may be frequency translated before it is applied to detector 220.

The steps of the calibration procedure can be performed manually or automatically. If the calibration system is incorporated in a vector modulator for self calibration, an automated approach is preferred. For an automated system, electronically controllable versions of certain devices must be used. These include, phase shifters 221 and 223, variable attenuators 225 and 227, DC signal sources 235, 237, 229 and 231, and switches 241, 243, 245 and 247. Automation can be provided using a microprocessor to control these devices and take measurement data from detector 220 to perform the calibration procedure with well known techniques.

We claim:

1. A method of calibrating a vector modulator having an input RF source connected to an input power divider providing two outputs, each connected to an adjustable phase shifter, the output of each adjustable phase shifter is independently connected to a mixer, one of the mixers is connected to an in-phase (I) signal path and the other mixer is connected to a quadrature (Q) signal path, the outputs from the mixers are connected to a power combiner, the power combiner produces an output RF signal having an amplitude, the method of calibrating requiring only the measuring of the amplitude of the output RF signal with a scalar detector connected to the RF output signal, the method comprising the following steps:
    (a) minimizing quadrature phase error;
    (b) minimizing carrier leakage;
    (c) balancing amplitudes of I and Q modulated signals;
    (d) balancing the amplitudes of quadrature calibration signals comprising:
        a positive quadrature DC reference signal (Qc+);
        a negative quadrature DC reference signal (Qc−);
        a positive in-phase DC reference signal (Ic+);
        a negative in-phase DC reference signal (Ic−); and
    (e) repeating steps (a) through (d) until no further changes are observed.

2. The calibration method of claim 1 wherein:
step (a) is performed by sequentially connecting combinations of positive DC reference signals Qc+, IC+, and negative DC reference signals Qc−, Ic−, to the I and Q mixers in place of the modulation signals, measuring the RF output amplitude for each of the four combinations of reference signals, and adjusting phase shifters located between the power divider and the mixers so that the sum of the RF output amplitudes produced by the (Qc+,Ic+) and (Qc−,Ic−) combinations is equal to the sum of the RF output amplitudes produced by the (Qc+,Ic−) and (Qc−,Ic+) combinations;
step (b) is performed by connecting carrier leak compensation sources to the I and Q mixers with the modulation inputs grounded, measuring the RF output amplitude and adjusting the carrier leak compensation sources to minimize RF output amplitude;
step (c) is performed by alternately grounding the I and Q modulation inputs while measuring the RF output amplitude, and adjusting attenuators connected between the modulation signal inputs and the mixers until the RF output amplitudes produced are equal; and
step (d) is performed by alternately applying the Qc+ and Qc− signals to the Q mixer with the I modulation signal connected to the I mixer, measuring the RF output amplitude and adjusting the amplitude of one of the Qc+ or Qc− signals until the output amplitudes they produce are equal, then alternately applying the Ic+ and Ic− signals to the I mixer with the quadrature modulation signal connected to the Q mixer, measuring the RF output amplitude and adjusting the amplitudes of the Ic+ or Ic− signals until the output amplitudes they produce are equal to the output amplitude produced by the Qc+ and Qc− signals.

3. The calibration method of claim 2 wherein the RF output amplitude is minimized in step (b) by:

measuring the RF output while varying the amplitude of the carrier leak compensation signal;

selecting a first carrier leak compensation interpolation amplitude near one side of the RF output minimum, in a region where the RF response has measurable slope, producing a first RF output amplitude;

selecting a second carrier leak compensation interpolation amplitude near the other side of the RF output minimum, in a region where the RF response has measurable slope, producing an RF output amplitude equal to the first RF output amplitude; and setting the amplitude of the carrier leak compensation signal at the average of the first and second interpolation amplitudes.

* * * * *